United States Patent
Wang

(10) Patent No.: US 10,230,004 B2
(45) Date of Patent: Mar. 12, 2019

(54) THIN FILM TRANSISTOR, ARRAY SUBSTRATE AND METHOD FOR FABRICATING THE SAME, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Shaozhuan Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/986,929

(22) Filed: May 23, 2018

(65) Prior Publication Data
US 2018/0269334 A1 Sep. 20, 2018

Related U.S. Application Data

(62) Division of application No. 15/096,916, filed on Apr. 12, 2016, now Pat. No. 10,008,613.

(30) Foreign Application Priority Data

May 15, 2015 (CN) .......................... 2015 1 0249298

(51) Int. Cl.
*H01L 29/786* (2006.01)
*H01L 29/06* (2006.01)
(Continued)

(52) U.S. Cl.
CPC ...... *H01L 29/78696* (2013.01); *H01L 27/124* (2013.01); *H01L 29/0673* (2013.01);
(Continued)

(58) Field of Classification Search
None
See application file for complete search history.

(56) References Cited

U.S. PATENT DOCUMENTS 5,561,308 A  10/1996 Kamata et al.
7,659,165 B2  2/2010 Koenenkamp
(Continued)

FOREIGN PATENT DOCUMENTS

CN  1708864 A  12/2005
CN  1940683 A  4/2007

OTHER PUBLICATIONS

First office Action dated Jun. 1, 2017 in corresponding Chinese Patent Application No. 201510249298.4 X.

*Primary Examiner* — Telly Green
(74) *Attorney, Agent, or Firm* — Nath, Goldberg & Meyer; Joshua B. Goldberg; Stanley N. Protigal

(57) ABSTRACT

The present disclosure provides a TFT, an array substrate and a fabricating method thereof and a display device. The TFT includes a gate, an active layer, a first electrode and a second electrode, the first electrode is arranged at one side of the active layer, the second electrode is arranged at the other side of the active layer, the first electrode, the active layer and the second electrode forms a stacked structure, the gate is arranged to surround the stacked structure, and the gate and the stacked structure are insulated and separated from each other. Under fixed occupation area, the conductive channel of the TFT of the present disclosure has increased width, so drain current in saturation region is increased without impacting aperture ratio of a display panel, which further optimizes performance of the TFT and (Continued)

the array substrate, and improves display effect of the display device.

9 Claims, 3 Drawing Sheets

(51) Int. Cl.
    *H01L 27/12*     (2006.01)
    *H01L 29/41*     (2006.01)
    *H01L 29/423*     (2006.01)

(52) U.S. Cl.
    CPC ........ *H01L 29/0676* (2013.01); *H01L 29/413* (2013.01); *H01L 29/42392* (2013.01); *H01L 29/7869* (2013.01); *H01L 29/78642* (2013.01)

(56) References Cited

U.S. PATENT DOCUMENTS

| | | |
|---|---|---|
| 8,183,567 B2 | 5/2012 | Kang et al. |
| 9,142,721 B2 | 9/2015 | Hawang et al. |
| 2006/0118975 A1* | 6/2006 | Koenenkamp ......... B82Y 10/00 257/335 |
| 2007/0108535 A1 | 5/2007 | Hoshizaki et al. |
| 2007/0285346 A1* | 12/2007 | Li ....................... G02B 27/017 345/8 |
| 2014/0203240 A1 | 7/2014 | Hawang et al. |
| 2015/0372195 A1 | 12/2015 | Hawang et al. |

* cited by examiner

THIN FILM TRANSISTOR, ARRAY SUBSTRATE AND METHOD FOR FABRICATING THE SAME, DISPLAY DEVICE

CROSS-REFERENCE TO RELATED APPLICATION

This is a Divisional Application of U.S. patent application Ser. No. 15/096,916, filed Apr. 12, 2016, an application claiming the benefit of Chinese Patent Application No. 201510249298.4, filed on May 15, 2015, the contents of each of which are incorporated by reference in the entirety.

FIELD OF THE INVENTION

The present invention belongs to the field of display technology, and particularly relates to a thin film transistor, an array substrate including the thin film transistor, a method for fabricating the array substrate, and a display device including the array substrate.

BACKGROUND OF THE INVENTION

Liquid crystal displays (LCDs) have characteristics such as small volume, light weight, low power consumption, low radiation, low manufacturing cost, etc., and thus have been widely applied in various electronic devices, for example, digital electronics such as displays, televisions, mobile phones, digital cameras, and the like. Among LCDs, thin film transistor liquid crystal display (TFT-LCD) is a main type of flat panel display (FPD). The drain current of a thin film transistor in saturation region is directly proportional to the width to length ratio of a channel, that is, the larger width to length ratio of a channel, the larger drain current of a thin film transistor in saturation region, which means that the wider the channel of a thin film transistor is, the better the performance of the device will be. However, due to the limitation of aperture ratio, the width of the channel of a thin film transistor is limited and thus cannot optimize the performance to the largest extent.

SUMMARY OF THE INVENTION

An object of the present invention is to provide a thin film transistor, an array substrate including the thin film transistor, a method for fabricating the array substrate and a display device including the array substrate, which can improve conductive properties of a thin film transistor without impacting the aperture ratio thereof.

The present disclosure provides a thin film transistor including a gate, an active layer, a first electrode and a second electrode, wherein the first electrode is arranged at one side of the active layer, while the second electrode is arranged at the other side of the active layer, the first electrode, the active layer and the second electrode forms a stacked structure, the gate is arranged to surround the stacked structure, and the gate and the stacked structure are insulated and separated from each other.

Optionally, the first electrode includes a plurality of first nano electrodes independent from each other, the active layer includes a plurality of nano active layers respectively provided on the plurality of first nano electrodes, the second electrode includes a plurality of second nano electrodes respectively provided on the plurality of nano active layers, and each group consisting of the first nano electrode, the nano active layer and the second nano electrode form a nanowire whose diameter is nano-scaled.

Optionally, the nanowire has a diameter ranging from 20 nm to 50 nm.

Optionally, the thin film transistor further includes a gate insulation layer covering the gate.

Optionally, a height of the nanowire is 105% to 120% as long as that of the gate insulation layer.

Optionally, an area enclosed by the gate insulation layer is filled with a filling layer, and the plurality of nanowires are insulated and separated from each other by the filling layer.

Optionally, a size of the filling layer in a height direction of the nanowire is 80% to 90% as long as the height of the nanowire.

Optionally, the gate is formed to have a circular ring-shaped structure surrounding the stacked structure.

According to another aspect of the present disclosure, there is provided an array substrate including a display area and a non-display area, each of which is provided therein with a plurality of thin film transistors, wherein each of the plurality of thin film transistors is the thin film transistor provided by the present disclosure.

Optionally, the array substrate includes a plurality of gate lines and a plurality of data lines, the plurality of gate lines and the plurality of data lines divide the display area into a plurality of pixel units, each of which is provided therein with the thin film transistor and a pixel electrode, a connection part is provided on the data line, a gate of the thin film transistor in each pixel unit is connected to the gate line, a first electrode thereof is connected to the pixel electrode, and a second electrode thereof is connected to the connection part.

Optionally, in the display area, the connection part covers the second electrode of the thin film transistor in the pixel unit.

Optionally, the array substrate further includes a low-level input terminal; in the non-display area, the plurality of thin film transistors are in one-to-one correspondence with the plurality of data lines, the non-display area is provided therein with a common wire connected to the low-level input terminal, both a gate and a first electrode of each thin film transistor in the non-display area are connected to the corresponding data line, and a second electrode thereof is connected to the common wire.

Optionally, in the non-display area, the common wire covers the second electrode of the thin film transistor in the non-display area.

Optionally, the array substrate further includes data line extension parts provided in the non-display area, wherein the data lines and the data line extension parts are provided in different layers insulated and separated from each other, and are connected through via holes, so that the gate and the first electrode of each thin film transistor in the non-display area are connected to the corresponding data line through the data line extension part.

According to still another aspect of the present disclosure, there is provided a method for fabricating an array substrate, the array substrate including a display area and a non-display area, and the method including steps of:

forming a pattern including a plurality of gate lines and a plurality of ring-shaped gates, wherein the plurality of ring-shaped gates includes ring-shaped gates in the display area and ring-shaped gates in the non-display area, and the gate lines are connected to the ring-shaped gates in the display area; and sequentially forming a first electrode, an active layer and a second electrode in an area enclosed by each gate, such that the first electrode is arranged at one side of the active layer, the second electrode is arranged at the other side of the active layer, and the first electrode, the active layer and the second electrode form a stacked structure.

Optionally, the step of sequentially forming a first electrode, an active layer and a second electrode in an area enclosed by each gate includes:

introducing a first source gas to form a plurality of first nano electrodes;

introducing a second source gas to form a plurality of nano active layers on the plurality of first nano electrodes, respectively; and introducing a third source gas to form a plurality of second nano electrodes on the plurality of nano active layers, respectively, each group consisting of the first nano electrode, the nano active layer and the second nano electrode forming a nanowire whose diameter is nano-scaled.

Optionally, the step of sequentially forming a first electrode, an active layer and a second electrode in an area enclosed by each gate further includes, before introducing a first source gas, a step of:

providing a catalyst particle layer including a plurality of catalyst particles, so that the first nano electrodes are formed at positions of the catalyst particles.

Optionally, the step of providing a catalyst particle layer includes:

forming the catalyst particle layer by a sputtering process, wherein the sputtering process lasts for a preset time to cause the catalyst particle layer to include a plurality of catalyst particles.

Optionally, the preset time is 5 seconds to 300 seconds.

Optionally, the step of providing a catalyst particle layer further includes:

annealing the catalyst particle layer.

Optionally, material of the catalyst particles is any one of gold, silver, copper, iron, aluminum, platinum, nickel, zinc and titanium.

Optionally, before the step of sequentially forming a first electrode, an active layer and a second electrode in an area enclosed by each gate, the method further includes steps of:

forming gate insulation layers covering the gates, wherein a height of the nanowire is 105% to 120% as long as that of the gate insulation layer; and forming a pattern including pixel electrodes such that the first electrode of each thin film transistor in the display area is formed on the pixel electrode.

Optionally, after the step of sequentially forming a first electrode, an active layer and a second electrode in an area enclosed by each gate, the method further includes steps of:

providing a colloidal insulation material in an area enclosed by the gate insulation layer; and curing the colloidal insulation material to form a filling layer whose size in a height direction of the nanowire is 80% to 90% as long as the height of the nanowire.

Optionally, before the step of forming a pattern including a plurality of gate lines and a plurality of ring-shaped gates, the method further includes a step of:

forming a pattern including data line extension parts in the non-display area, so that the gate and the first electrode of each thin film transistor in the non-display area are formed on the data line extension part.

Optionally, after the step of curing the colloidal insulation material to form a filling layer, the method further includes a step of:

forming a pattern including data lines, connection parts and a common wire, such that the data lines are connected to the data line extension parts, the connection parts cover the second electrodes of the thin film transistors in the display area, and the common wire is connected to a low-level input terminal and covers the second electrodes of the thin film transistors in the non-display area.

Optionally, before the step of forming a pattern including data lines, connection parts and a common wire, the method further includes a step of:

forming via holes penetrating through at least the gate insulation layer, so that the data lines are connected to the data line extension parts through the via holes, and the gate and the first electrode of each thin film transistor in the non-display area are connected to the corresponding data line through the data line extension part.

According to still another aspect of the present disclosure, there is provided a display device comprising any one of the array substrates provided by the present disclosure.

In the present disclosure, when a certain voltage is applied to the gate of a thin film transistor, a conductive channel is formed in a stacked structure, since the gate is arranged to surround the stacked structure, the formed electric field is divergent or convergent, and therefore, the conductive channel has a width equal to the perimeter of the bottom surface of the stacked structure. Compared with the prior art, when the area occupied by a thin film transistor is fixed, the conductive channel of the thin film transistor of the present disclosure has a larger width, so a drain current in saturation region is increased without impacting the aperture ratio of a display panel; moreover, the first electrode, the active layer and the second electrode of a thin film transistor of the present disclosure form a stacked structure, therefore, when the thin film transistor is turned on, lateral current interference can be decreased and high carrier mobility can be achieved, which further optimizes performance of the thin film transistor and the array substrate, and improves display effect of the display device.

BRIEF DESCRIPTION OF THE DRAWINGS

Accompanying drawings, which constitute a part of the specification, are used for providing a further understanding of the present invention, and used for explaining the present invention together with the following specific implementations, but not intended to limit the present invention. In the accompanying drawings.

DETAILED DESCRIPTION OF THE EMBODIMENTS

The specific implementations of the present disclosure will be described in detail below in conjunction with the accompanying drawings. It should be understood that, the specific implementations described herein are merely for describing and explaining the present invention, rather than limiting the present invention.

Figure 1:
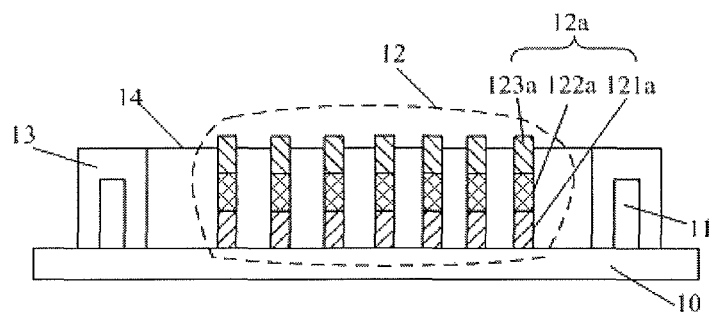
FIG. 1 is a schematic structure diagram of a thin film transistor in an embodiment of the present disclosure.
Figure 2:
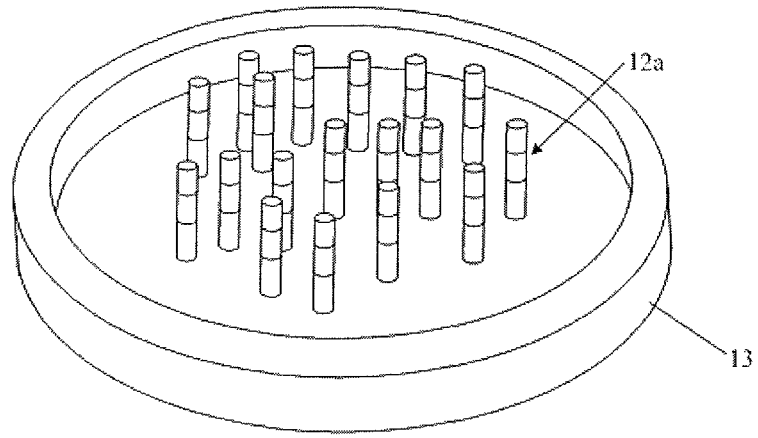
FIG. 2 is a perspective structure diagram of a thin film transistor in an embodiment of the present disclosure.

As a first aspect of the present disclosure, there is provided a thin film transistor, which, as shown in FIGS. 1 and 2, includes a gate 11, an active layer, a first electrode and a second electrode, the first electrode is arranged at one side of the active layer, the second electrode is arranged at the other side of the active layer, the first electrode, the active layer and the second electrode forms a stacked structure 12, the gate 11 is arranged to surround the stacked structure 12, and the gate 11 and the stacked structure 12 are insulated and separated from each other.

In the present disclosure, after a certain voltage is applied to the gate 11, a conductive channel is formed in the stacked structure 12, since the gate 11 is arranged to surround the stacked structure 12, the formed electric field is divergent or convergent, and therefore, the conductive channel has a width equal to the perimeter of the bottom surface of the stacked structure 12. Compared with the prior art, when the area occupied by a thin film transistor is fixed, the conductive channel of the thin film transistor of the present disclosure has a larger width, so that a drain current of the thin film transistor in saturation region is increased without impacting the aperture ratio of a display panel; moreover, the first electrode, the active layer and the second electrode of the thin film transistor of the present disclosure form a stacked structure, and therefore, when the thin film transistor is turned on, lateral current interference can be decreased and high carrier mobility can be achieved, which further optimizes performance of the thin film transistor.

Specifically, the gate 11 may be formed to have a circular ring-shaped structure surrounding the stacked structure 12, so that the distribution of electric field is more even after a voltage is applied to the gate 11, and carriers in a conductive channel formed between the first electrode and the second electrode is distributed more evenly, thereby improving conductive properties.

The specific shape of the stacked structure 12 is not limited in the present disclosure, for example, the stacked structure 12 may be a columnar structure, and the gate 11 is arranged to surround the columnar structure.

In some embodiments, as shown in FIG. 1, the first electrode includes a plurality of first nano electrodes 121a independent from each other, the active layer includes a plurality of nano active layers 122a respectively provided on the plurality of first nano electrodes 121a, the second electrode includes a plurality of second nano electrodes 123a respectively provided on the plurality of nano active layers 122a, and each group consisting of the first nano electrode 121a, the nano active layer 122a and the second nano electrode 123a form a nanowire 12a whose diameter is nano-scaled. Because the nanowire 12a has a small diameter and thus has a small body surface, a gate voltage required for forming an inversion layer is small, thereby lowering power consumption of the driving circuit. In addition, since the nanowire 12a has a small volume, a large aperture ratio of the display panel can be achieved.

The first nano electrode 121a and the second nano electrode 123a may be made of a metal such as zinc, copper, etc. The nano active layer 122a may be made of a metal oxide, such as indium oxide, zinc oxide, etc.

Specifically, the diameter of the nanowire 12a may be in the range of 20 nm to 50 nm.

Figure 3:
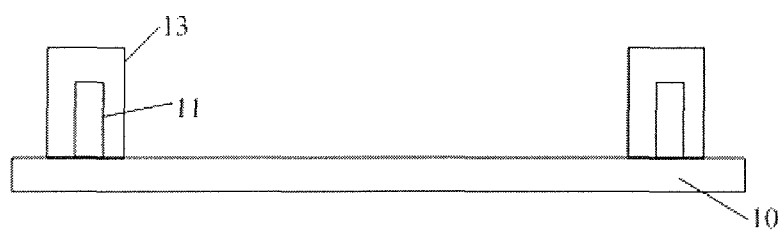
FIG. 3 is a schematic structure diagram of a gate insulation layer in an embodiment of the present disclosure.

As shown in FIGS. 1 and 3, the thin film transistor further includes a gate insulation layer 13 covering the gate 11, so as to insulate and separate the stacked structure 12 formed by the first electrode, the active layer and the second electrode from the gate 11.

The thin film transistor provided by the present disclosure may be arranged in a pixel unit of an array substrate in such a way that the first electrode is connected to a data line and the second electrode is connected to a pixel electrode. Specifically, the height of the nanowire 12a is 105% to 120% as long as that of the gate insulation layer 13, in order to facilitate connection between the first nano electrode 121a of each nanowire 12a and the data line 30.

Further, an area enclosed by the gate insulation layer 13 is filled with a filling layer 14, and the plurality of nanowires 12a are insulated and separated from each other by the filling layer 14. The filling layer 14 has a certain protective effect on the nanowire 12a and prevents external impurities and moisture from impacting the nanowire 12a, thus improving reliability of the thin film transistor.

The material of the filling layer 14 is not specifically limited in the present disclosure, as long as the filling layer 14 can insulate and separate the nanowires 12a from each other. For example, the material of the filling layer 14 may be a light-curing adhesive, in order to facilitate applying the filling layer 14.

Figure 4:
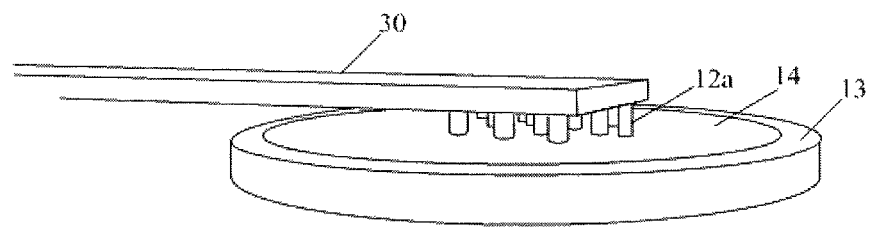
FIG. 4 is a diagram schematically illustrating connection between a thin film transistor and a data line in an embodiment of the present disclosure.

The size, in a height direction of the nanowire 12a, of the filling layer 14 is 80% to 90% as long as the height of the nanowire 12a, so that the nanowire 12a is protected but not completely submerged by the filling layer 14, which facilitates connection between the nanowire 12a and the data line 30 (as shown in FIG. 4).

As a second aspect of the present disclosure, there is provided an array substrate including a display area (the portion above the dotted line in FIG. 5) and a non-display area (the portion below the dotted line in FIG. 5), each of which is provided with a plurality of thin film transistors, wherein each of the plurality of thin film transistors is the above-described thin film transistor provided by the present disclosure.

Because the conductive channel of the thin film transistor of the present disclosure has an increased width, a drain current in saturation region is increased without impacting the aperture ratio, so performance of the thin film transistor is increased, and further, performance and quality of the array substrate including the thin film transistor are increased.

Figure 5:
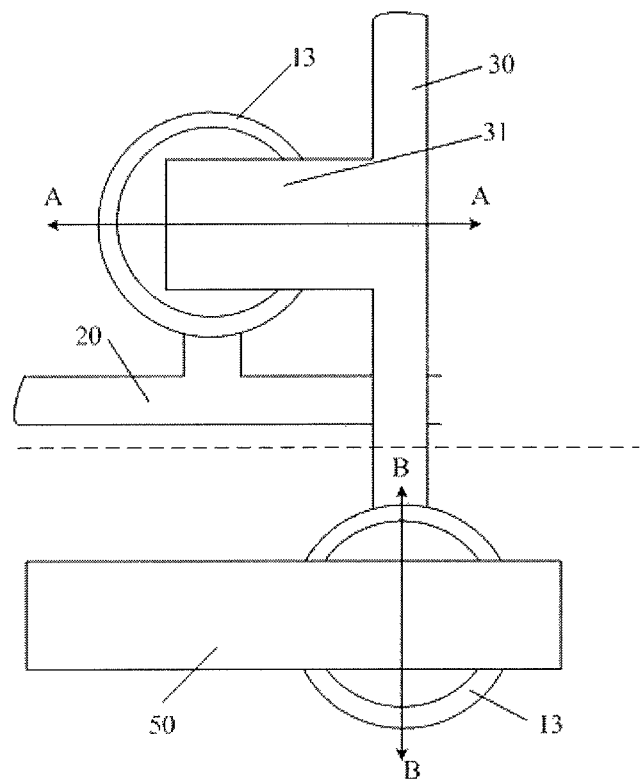
FIG. 5 is a partial structure diagram of an array substrate.
Figure 6:
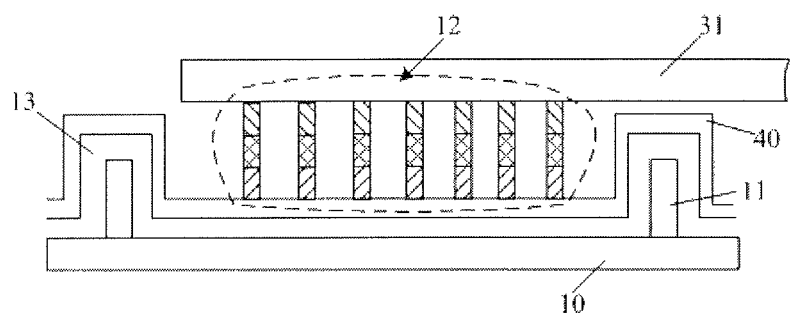
FIG. 6 is a cross-sectional diagram taken along Line A-A in FIG. 5.

Specifically, as shown in FIGS. 5 and 6, the array substrate includes a plurality of gate lines 20 and a plurality of data lines 30, the plurality of gate lines 20 and the plurality of data lines 30 divide the display area into a plurality of pixel units, each of which is provided with the thin film transistor and a pixel electrode 40, the data line 30 is provided thereon with a connection part 31, a gate of the thin film transistor in each pixel unit is connected to the gate line 20, a first electrode thereof is connected to the pixel electrode 40, and a second electrode thereof is connected to the connection part 31. It should be understood that, the data line 30 and the pixel electrode 40 are insulated and separated from each other.

As described above, the first electrode of the thin film transistor includes a plurality of first nano electrodes, the active layer thereof includes a plurality of nano active layers, the second electrode thereof includes a plurality of second nano electrodes, and in this case, in the display area, the connection part 31 covers the second electrode. It should be noted that, in the context of the present disclosure, the expression "a part covers an electrode" not only means that the part completely covers the electrode but also means that the part is in direct contact with the electrode. For example, if the connection part 31 covers the second electrode, it not only means that the connection part 31 completely covers the second electrode but also means that the connection part 31 is in direct contact with the second electrode.

Figure 7:
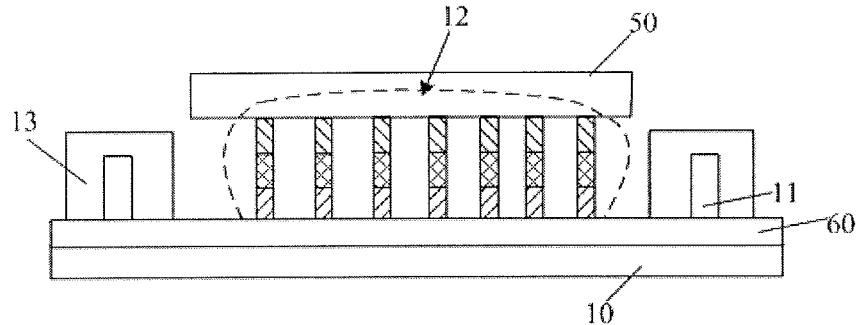
FIG. 7 is a cross-sectional diagram taken along Line B-B in FIG. 5.

The array substrate may further include a low-level input terminal, in the non-display area, the plurality of thin film transistors are in one-to-one correspondence with the plurality of data lines 30, and the non-display area is provided with a common wire 50 connected to the low-level input terminal. As shown in FIG. 7, both the gate and the first electrode of a thin film transistor in the non-display area are connected to a corresponding data line 30 (data line 30 is not shown in FIG. 7), and the common wire 50 covers the second electrode. In this case, when relatively large static electricity is generated on a certain data line 30, the corresponding thin film transistor is turned on, and then the static electricity is released to the low-level input terminal. The low-level input terminal may be a grounded terminal.

In some embodiments, the array substrate further includes data line extension parts 60 provided in the non-display area, and the data lines 30 and the data line extension parts 60 are provided in different layers insulated and separated from each other, and are connected through via holes. The data line extension parts 60 may be directly formed on the base 10 of the array substrate, as shown in FIG. 7, and in this way, the gate and the first electrode of the thin film transistor in the non-display area are connected to the corresponding data line 30 through the data line extension part 60.

Figure 8:
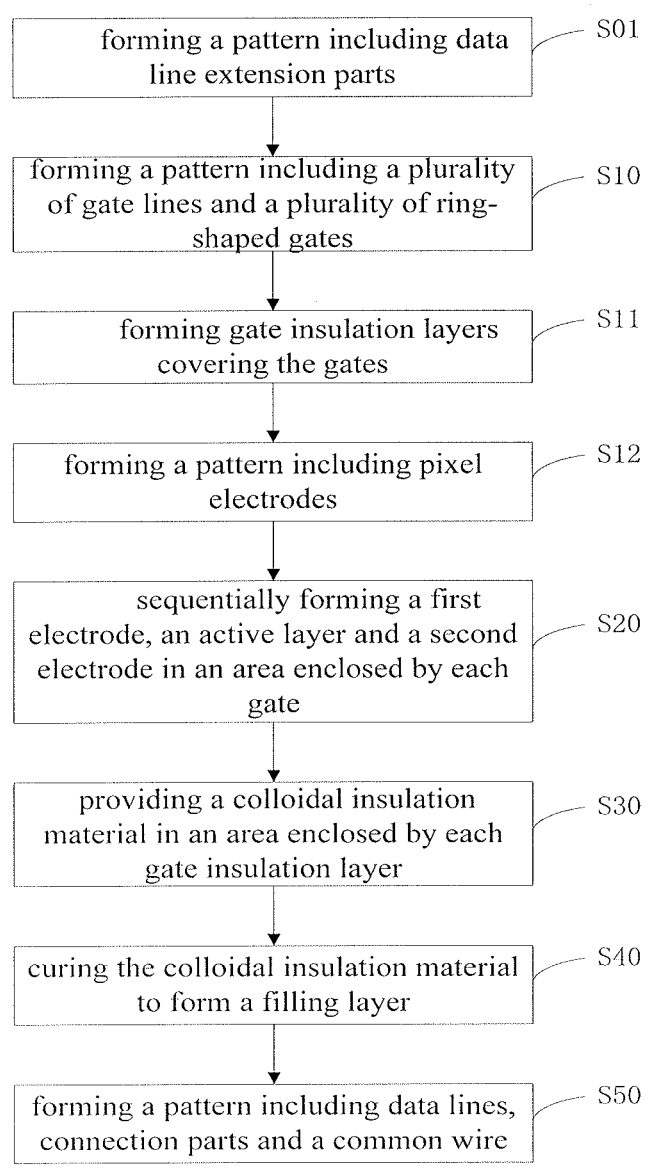
FIG. 8 is a flowchart of a method for fabricating an array substrate in an embodiment of the present disclosure.

As a third aspect of the present disclosure, there is provided a method for fabricating an array substrate, and as shown in FIG. 8, the method includes steps of:

S10: forming a pattern including a plurality of gate lines and a plurality of ring-shaped gates, wherein the plurality of ring-shaped gates includes ring-shaped gates in a display area and ring-shaped gates in a non-display area, and the gate lines are connected to the ring-shaped gates in the display area; and S20: sequentially forming a first electrode, an active layer and a second electrode in an area enclosed by each gate, wherein the first electrode is provided at one side of the active layer, the second electrode is provided at the other side of the active layer, and the first electrode, the active layer and the second electrode form a stacked structure.

The specific process of step S10 is not limited, as an optional implementation, a photolithographic patterning process may be adopted, and step S10 may include:

sequentially forming a gate material layer and a photoresist layer on a base;

exposing and developing the photoresist layer such that parts of the photoresist layer corresponding to the gate lines and the gate are reserved;

etching off a part of the gate material layer not covered by the photoresist layer; and stripping off the photoresist layer, thereby forming the pattern including the gates and the gate lines, wherein the gates and the gate lines in the display area are connected.

The part of the gate material layer not covered by the photoresist layer may be dry-etched or wet-etched.

As described above, the first electrode includes a plurality of first nano electrodes 121a independent from each other, the active layer includes a plurality of nano active layers 122a respectively provided on the plurality of first nano electrodes 121a, the second electrode includes a plurality of second nano electrodes 123a respectively provided on the plurality of nano active layers 122a, and each group consisting of the first nano electrode 121a, the nano active layer 122a and the second nano electrode 123a form a nanowire 12a.

Specifically, step S20 includes:

S201: introducing a first source gas to form the plurality of first nano electrodes;

S202: introducing a second source gas to form the plurality of nano active layers on the plurality of first nano electrodes, respectively; and S203: introducing a third source gas to form the plurality of second nano electrodes on the plurality of nano active layers, respectively, each group consisting of the first nano electrode, the nano active layer and the second nano electrode forming a nanowire whose diameter is nano-scaled.

The first source gas, the second source gas and the third source gas may be selected based on the material of the nanowire to be formed, for example, the material of the first electrode may be zinc, and then the first source gas may be a gas containing elemental zinc; the material of the active layer may be indium oxide, and then the second source gas may be a gas containing elemental indium and oxygen, or may be a gas containing indium oxide, or may be oxygen and a gas formed by organics containing indium.

The nanowire 12a may be fabricated by using a Vapor-Solid (VS) growth mechanism. A surface for growing nanowires has a plurality of nano-scaled protrusions or recessions and is at a low temperature, the first source gas is adsorbed on the protrusions or recessions to form crystal nucleus, and then to form crystal nucleus-centered grains, and with continuous introduction of the first source gas, the grains keep growing, thereby forming first nano electrodes. Next, the second source gas and the third source gas are sequentially introduced to form the nano active layers and the second nano electrodes, respectively.

The nanowire 12a may be fabricated by using a Vapor-Liquid-Solid (VLS) growth mechanism, that is, before step S201, step S20 further includes a step of:

S200: providing a catalyst particle layer including a plurality of catalyst particles, so that the first nano electrodes are formed at positions of the catalyst particles.

Particle sizes of the catalyst particles should be nano-scaled, so that the first nano electrodes have nano-scaled diameters. In this case, during introduction of the first source gas, the catalyst particles react with the first source gas to form an alloy, which turns into alloy droplets at high temperature. With continuous dissolution of the first source gas into the alloy droplets, grains are precipitated when the alloy droplets are saturated, so that the alloy droplets become under-saturated again and are at the top of the precipitated grains; with continuous introduction of the first source gas, grains are precipitated when the alloy droplets are saturated again, and after several cycles, the grains keep growing to form the first nano electrodes. The nano active layers and the second nano electrodes are formed in the similar way as the first nano electrodes, which is not repeated herein.

Specifically, step S20 includes:

forming the catalyst particle layer by a sputtering process, wherein the sputtering process lasts for a preset time, so that the catalyst particle layer is not formed to be a thin film but include a plurality of catalyst particles.

Specifically, the preset time may be 5 seconds to 300 seconds.

Further, step S200 further includes: annealing the catalyst particle layer, wherein the annealing temperature may be 300° C. to 500° C., so as to make the shapes and distribution of the catalyst particles more even.

The material of the catalyst particles may be any one of gold, silver, copper, iron, aluminum, platinum, nickel, zinc and titanium.

When growth of the plurality of nanowires is completed, the first electrodes, the active layers and the second electrodes are fabricated. Compared with a method for fabricating a thin film transistor in the prior art, the method of the present disclosure is simpler, and can omit several repeated steps, thereby lowering production costs.

Further, as shown in FIG. 8, before step S20, the method further includes steps S11 and S12.

At step S11, gate insulation layers covering the gates are formed. Like the gates, the gate insulation layers may also be formed by a photolithographic patterning process, which is not repeated herein. Optionally, the height of the nanowire formed in step S203 is 105% to 120% as long as that of the gate insulation layer.

At step S12, a pattern including pixel electrodes is formed such that the first electrode of each thin film transistor in the display area is formed on the pixel electrode.

Further, after step S20, the method further includes steps of:

S30: providing, in an area enclosed by each gate insulation layer, a colloidal insulation material, wherein the colloidal insulation material may be provided by various methods, for example, by doping; and S40: curing the colloidal insulation material to form a filling layer whose size in a height direction of the nanowire is 80% to 90% as long as the height of the nanowire, so that the nanowires are not completely submerged but well protected by the filling layer.

As shown in FIG. 8, before step S10, the method further includes a step of:

S01: forming a pattern including data line extension parts in the non-display area, so that the gate and the first electrode of each thin film transistor in the non-display area are formed on the data line extension part, wherein the data line extension parts may be directly formed on the base.

As shown in FIG. 8, after step S40, the method further includes a step of:

S50: forming a pattern including data lines, connection parts and a common wire, such that the data lines are connected to the data line extension parts, the connection parts cover the second electrodes of the thin film transistors in the display area, and the common wire is connected to a low-level input terminal and covers the second electrodes of the thin film transistors in the non-display area.

At least the gate insulation layer is provided between the layer in which the data lines are located and the layer in which the data line extension parts are located, in order to facilitate connection between the data lines and the data line extension parts, the method further includes, before step S50, a step of:

S41, forming via holes penetrating through at least the gate insulation layer, so that the data lines are connected to the data line extension parts through the via holes, and the gate and the first electrode of each thin film transistor in the non-display area are connected to the corresponding data line through the data line extension part.

As a fourth aspect of the present disclosure, there is provided a display device comprising the above array substrate provided by the present disclosure. Because the conductive channel of the thin film transistor of the present disclosure has a large width, a drain current in saturation region can be increased, and high electron mobility can be achieved, so that performance of the thin film transistor is enhanced, and further display effect of the display device is improved.

It could be understood that the above implementations are merely exemplary implementations adopted for describing the principle of the disclosure, but the disclosure is not limited thereto. Various variations and improvements may be made by those of ordinary skill in the art without departing from the spirit and essence of the disclosure, and these variations and improvements shall also be regarded as falling into the protection scope of the disclosure.

The invention claimed is:

1. A method for fabricating an array substrate, wherein the array substrate comprises a display area and a non-display area, and the method comprises steps of:

forming a pattern comprising a plurality of gate lines and a plurality of ring-shaped gates, wherein the plurality of ring-shaped gates comprises ring-shaped gates in the display area and ring-shaped gates in the non-display area, and the gate lines are connected to the ring-shaped gates in the display area; and sequentially forming a first electrode, an active layer and a second electrode in an area enclosed by each of the plurality of ring-shaped gates, such that the first electrode is arranged at one side of the active layer, the second electrode is arranged at the other side of the active layer, and the first electrode, the active layer and the second electrode form a stacked structure, wherein the gate and the stacked structure are insulated and separated from each other.

2. The method according to claim 1, wherein the step of sequentially forming a first electrode, an active layer and a second electrode in an area enclosed by each of the plurality of ring-shaped gates comprises:

introducing a first source gas to form a plurality of first nano electrodes;

introducing a second source gas to form a plurality of nano active layers on the plurality of first nano electrodes, respectively; and introducing a third source gas to form a plurality of second nano electrodes on the plurality of nano active layers, respectively, each group consisting of the first nano electrode, the nano active layer and the second nano electrode forming a nanowire whose diameter is nano-scaled, wherein in each group consisting of the first nano electrode, the nano active layer and the second nano electrode, the nano active layer is formed on only one surface of the first nano electrode, and the second nano electrode is formed on only one surface of the nano active layer away from the first nano electrode.

3. The method according to claim 2, wherein the step of sequentially forming a first electrode, an active layer and a second electrode in an area enclosed by each of the plurality of ring-shaped gates further comprises, before introducing a first source gas, a step of:

providing a catalyst particle layer comprising a plurality of catalyst particles, so that the first nano electrodes are formed at positions of the catalyst particles.

4. The method according to claim 3, wherein the step of providing a catalyst particle layer comprises:

forming the catalyst particle layer by a sputtering process, wherein the sputtering process lasts for a preset time to cause the catalyst particle layer to comprise a plurality of catalyst particles, and the preset time is 5 seconds to 300 seconds; and annealing the catalyst particle layer.

5. The method according to claim 3, wherein before the step of sequentially forming a first electrode, an active layer and a second electrode in an area enclosed by each of the plurality of ring-shaped gates, the method further comprises steps of:
- forming a gate insulation layer covering the gate, wherein a height of the nanowire is 105% to 120% as long as that of the gate insulation layer; and
- forming a pattern comprising pixel electrodes such that the first electrode of each thin film transistor in the display area is formed on the pixel electrode.

6. The method according to claim 5, wherein after the step of sequentially forming a first electrode, an active layer and a second electrode in an area enclosed by each of the plurality of ring-shaped gates, the method further comprises steps of:
- providing a colloidal insulation material in an area enclosed by the gate insulation layer; and
- curing the colloidal insulation material to form a filling layer whose size in a height direction of the nanowire is 80% to 90% as long as the height of the nanowire.

7. The method according to claim 6, wherein before the step of forming a pattern comprising a plurality of gate lines and a plurality of ring-shaped gates, the method further comprises a step of:
- forming a pattern comprising data line extension parts in the non-display area, so that the gate and the first electrode of each thin film transistor in the non-display area are formed on the data line extension part.

8. The method according to claim 7, wherein after the step of curing the colloidal insulation material to form a filling layer, the method further comprises a step of:
- forming a pattern comprising data lines, connection parts and a common wire, such that the data lines are connected to the data line extension parts, the connection parts cover the second electrodes of the thin film transistors in the display area, and the common wire is connected to a low-level input terminal and covers the second electrodes of the thin film transistors in the non-display area.

9. The method according to claim 8, wherein before the step of forming a pattern comprising data lines, connection parts and a common wire, the method further comprises a step of:
- forming via holes penetrating through at least the gate insulation layer, so that the data lines are connected to the data line extension parts through the via holes, and the gate and the first electrode of each thin film transistor in the non-display area are connected to the corresponding data line through the data line extension part.

* * * * *